United States Patent
Tatematsu et al.

(10) Patent No.: US 12,013,447 B2
(45) Date of Patent: Jun. 18, 2024

(54) MAGNETO-SENSITIVE WIRE FOR MAGNETIC SENSORS AND PRODUCTION METHOD THEREFOR

(71) Applicant: AICHI STEEL CORPORATION, Tokai (JP)

(72) Inventors: Shunichi Tatematsu, Aichi-ken (JP); Akihiro Shimode, Aichi-ken (JP)

(73) Assignee: AICHI STEEL CORPORATION, Tokai (JP)

(*) Notice: Subject to any disclaimer, the term of this patent is extended or adjusted under 35 U.S.C. 154(b) by 611 days.

(21) Appl. No.: 17/273,541

(22) PCT Filed: Oct. 2, 2019

(86) PCT No.: PCT/JP2019/038876
§ 371 (c)(1),
(2) Date: Mar. 4, 2021

(87) PCT Pub. No.: WO2020/090333
PCT Pub. Date: May 7, 2020

(65) Prior Publication Data
US 2021/0190886 A1    Jun. 24, 2021

(30) Foreign Application Priority Data
Nov. 2, 2018 (JP) .................... 2018-206986

(51) Int. Cl.
C22C 45/04     (2006.01)
C22F 1/10      (2006.01)
(Continued)

(52) U.S. Cl.
CPC ............ *G01R 33/063* (2013.01); *C22C 45/04* (2013.01); *C22F 1/10* (2013.01); *H10N 50/01* (2023.02); *H10N 50/85* (2023.02)

(58) Field of Classification Search
None
See application file for complete search history.

(56) References Cited

U.S. PATENT DOCUMENTS 4,527,614 A      7/1985  Masumoto et al.
4,657,604 A  *   4/1987  Ogasawara ............ C22C 45/04
                                                            420/440
(Continued)

FOREIGN PATENT DOCUMENTS

EP    0 212 863 A1   3/1987
EP    1 237 165 A2   9/2002
(Continued)

OTHER PUBLICATIONS

Extended European Search Report dated Nov. 19, 2021 in European Application No. 19880186.2.
(Continued)

*Primary Examiner* — George Wyszomierski
(74) *Attorney, Agent, or Firm* — Sughrue Mion, PLLC

(57) ABSTRACT

An object is to provide a magneto-sensitive wire that exhibits a stable anisotropic magnetic field even under a high-temperature environment and can achieve expansion of the measurement range of an MI sensor, etc. The present invention provides a magneto-sensitive wire for magnetic sensors that comprises a Co-based alloy having a composite structure in which crystal grains are dispersed in an amorphous phase. The Co-based alloy contains 0.05 to 0.80 at %, preferably 0.10 to 0.60 at %, of Cu with respect to 100 at % of the Co-based alloy as a whole. The Co-based alloy may further contain 65 to 90 at % of the group of magnetic elements consisting of Co, Fe, and Ni as the total, 15 to 27 at % of Si and/or B as the total, and 0.5 to 2.5 at % of Mo. Such a magneto-sensitive wire is excellent in the heat resistance and exhibits a stable anisotropic magnetic field even under a high-temperature environment. By using the
(Continued)

magneto-sensitive wire of the present invention, it is possible, for example, to efficiently produce an MI sensor with an expanded measurement range.

10 Claims, 2 Drawing Sheets

(51) Int. Cl.
    *G01R 33/06*     (2006.01)
    *H10N 50/01*     (2023.01)
    *H10N 50/85*     (2023.01)

(56) References Cited

U.S. PATENT DOCUMENTS

| | | | |
|---|---|---|---|
| 4,781,771 | A | 11/1988 | Masumoto et al. |
| 4,859,256 | A | 8/1989 | Sawa et al. |
| 5,240,066 | A | 8/1993 | Gorynin et al. |
| 6,648,990 | B2 | 11/2003 | Yoshizawa |
| 7,473,325 | B2 | 1/2009 | Yoshizawa et al. |
| 8,610,427 | B2 | 12/2013 | Honkura et al. |
| 2002/0189718 | A1 | 12/2002 | Yoshizawa |
| 2008/0129437 | A1 | 6/2008 | Yoshizawa et al. |
| 2011/0080164 | A1 | 4/2011 | Honkura et al. |

FOREIGN PATENT DOCUMENTS

| | | |
|---|---|---|
| EP | 1 840 906 A1 | 10/2007 |
| EP | 2 276 082 A1 | 1/2011 |
| JP | 57-079052 A | 5/1982 |
| JP | 62-027539 A | 2/1987 |
| JP | 02-310346 A | 12/1990 |
| JP | 04000348 A | 1/1992 |
| JP | 08-503891 A | 4/1996 |
| JP | 10-149911 A | 6/1998 |
| WO | 93/05904 A2 | 4/1993 |
| WO | 2009/119081 A1 | 10/2009 |

OTHER PUBLICATIONS

Ilker Kucuk et al., "Magnetocaloric and magnetoresistance properties in Co-based $(Co_{0.402}FE_{0.201}Ni_{0.067}B_{0.227} Si_{0.053} Nb_{0.05})100_{-x}CU_x (x=0-1)$ glassy alloys", Philosophical Magazine, 2016, vol. 96, No. 30, pp. 3120-3130 (12 pages total).

Dong-Ming Chen et al., "Correlation of magnetic domains, microstructure and GMI effect of Joule-annealed melt-extracted $CO_{68.15}FE_{4.35} Si_{12.25}B_{13.75}Nb_1Cu_{0.5}$ microwires for double functional sensors", Physica Status Solidi. A: Applications and Materials Science, 2013, vol. 210, No. 11, pp. 2515-2520 (6 pages total).

International Preliminary Report on Patentability dated Apr. 27, 2021 in International Application No. PCT/JP2019/038876.

K. Mohri et al., "Magneto-Impedance Element", IEEE Transactions on Magnetics, Jul. 1995, p. 2455-2460, vol. 31, No. 4.

International Search Report for PCT/JP2019/038876 dated Dec. 24, 2019 [PCT/ISA/210].

\* cited by examiner (Alloy composition 1 / Cu : 0%)

(Alloy composition 1 / Cu : 0.20%)

MAGNETO-SENSITIVE WIRE FOR MAGNETIC SENSORS AND PRODUCTION METHOD THEREFOR

CROSS REFERENCE TO RELATED APPLICATIONS

This application is a National Stage of International Application No. PCT/JP2019/038876 filed Oct. 2, 2019, claiming priority based on Japanese Patent Application No. 2018-206986 filed Nov. 2, 2018.

TECHNICAL FIELD

The present invention relates to a magneto-sensitive wire used for magnetic sensors and also relates to relevant techniques.

BACKGROUND ART

Magnetic sensors have been used, such as fluxgate sensors (FG sensors), Hall sensors, giant magneto-resistive sensors (GMR sensors), and magneto-impedance sensors (MI sensors). MI sensors are superior to other sensors in terms of the sensitivity, responsivity, power consumption, and other properties and they are thus being used not only in the field of mobile devices such as smartphones but also in various fields such as automobiles and medical services.

In an MI sensor, an amorphous wire (non-crystalline wire) to which a high-frequency current or a pulse current is applied is used as a magneto-sensitive body, and the magnitude of magnetization rotation occurring in the circumferential direction in response to the strength of the surrounding magnetic field is detected as a change in impedance or a voltage.

As the functionality of mobile terminals (such as smartphones) and the like has been enhanced, highly sensitive magnetic sensors are desired, such as those having a measurement range (e.g., about ±48 mT) that is far wider than the measurement range (e.g., about ±0.3 to 12 mT) required for an electronic compass to measure the geomagnetism (about 50 µT).

In the case of MI sensors, the measurement range correlates with how likely the magnetization rotation occurs in the amorphous wire which is a soft magnetic material. How likely the magnetization rotation occurs depends greatly on an anisotropic magnetic field (Hk) of the amorphous wire. When the anisotropic magnetic field is small, the magnetization rotation is likely to occur and the measurement range is narrowed. In contrast, when the anisotropic magnetic field is large, the magnetization rotation is less likely to occur and the measurement range is widened.

Conventionally, adjustment of such an anisotropic magnetic field has been performed by control of the internal stress to remain in the amorphous wire. As the internal stress becomes large, the anisotropic magnetic field also becomes large, while as the internal stress becomes small, the anisotropic magnetic field also becomes small. The internal stress has been given by tension annealing (TA) such that the amorphous wire is heated while applying tensile stress (tension) to the amorphous wire, and the control of the internal stress has been performed by adjusting the condition of the tension annealing.

The tension annealing can be performed by heating the amorphous wire, to which tension is applied, in a furnace or by energizing the amorphous wire to heat it. In any case, the conventional tension annealing has been performed by heating in a range in which the amorphous state is maintained (heating at a temperature lower than the crystallization temperature or heating for a very short time during which crystallization does not proceed even when the temperature is not lower than the crystallization temperature). Descriptions relevant to such tension annealing for amorphous wires are found in the following documents.

PRIOR ART DOCUMENTS

Patent Documents

[Patent Document 1] WO2009/119081

Non-Patent Documents

[Non-Patent Document 1] IEEE Trans. Magn., 31 (1995), 2455-2460

SUMMARY OF INVENTION

Technical Problem

Patent Document 1 describes performing the tension annealing on an amorphous wire produced by a Taylor Ulitovski method (referred to as a "modified Tailor method"). Patent Document 1, however, only especially describes a magnetic domain structure of the amorphous wire.

In Non-Patent Document 1, the tension annealing is performed on an amorphous wire produced by an in-rotating-liquid spinning method. Non-Patent Document 1, however, merely describes adjusting the anisotropic magnetic field by simply changing the temperature and stress during the tension annealing.

The present invention has been made in view of such circumstances and an object of the present invention is to provide a magneto-sensitive wire for magnetic sensors and relevant techniques that can stably develop a desired anisotropic magnetic field.

Solution to Problem

As a result of intensive studies to achieve the above object, the present inventors have newly found that the use of an amorphous wire comprising a Co-based alloy that contains Cu relaxes the change (temperature dependence) of an anisotropic magnetic field with respect to the treatment temperature during heat treatment (such as TA) or lowers the treatment temperature. Developing this achievement, the present inventors have accomplished the present invention, which will be described below.

<<Magneto-Sensitive Wire for Magnetic Sensors>>

(1) The present invention provides a magneto-sensitive wire for magnetic sensors that comprises a Co-based alloy having an amorphous phase. The Co-based alloy contains 0.05 to 0.80 at % of Cu with respect to 100 at % of the Co-based alloy as a whole and has a composite structure in which crystal grains are dispersed in the amorphous phase.

(2) The magneto-sensitive wire for magnetic sensors (simply referred to as a "magneto-sensitive wire") of the present invention can stably exhibit a desired anisotropic magnetic field due to the fine crystals dispersed in the amorphous phase. This anisotropic magnetic field is different from an anisotropic magnetic field generated only due to the residual internal stress as in the conventional technique and is therefore stable even under a high-temperature environment, for example, of about 300° C. The use of such a magneto-sensitive wire of the present invention allows a magnetic sensor to be obtained, for example, with an expanded measurement range, improved reliability under a high-temperature environment, and other advantageous properties. Moreover, the magneto-sensitive wire of the present invention has an anisotropic magnetic field stable even at a high temperature, and therefore the performance of the magneto-sensitive wire does not deteriorate even when it is subjected to a reflow step of heating to about 300° C., for example, during the production of an MI element.

<<Method of Producing Magneto-Sensitive Wire for Magnetic Sensors>>

(1) The present invention can also be perceived as a method of producing a magneto-sensitive wire for magnetic sensors. This method includes a heat treatment step of heating an amorphous wire comprising a Co-based alloy at a specific temperature equal to or higher than a crystallization start temperature and lower than a crystallization end temperature. The Co-based alloy contains 0.05 to 0.80 at % of Cu. According to the method, a magneto-sensitive wire for magnetic sensors that comprises a composite structure in which crystal grains are dispersed in an amorphous phase is obtained.

(2) First, when a wire comprising an amorphous Co-based alloy (simply referred to as an "amorphous wire") is heated at a temperature equal to or higher than the crystallization start temperature for a predetermined time, fine crystal grains (simply referred to as "fine crystals") appear in the amorphous phase. The fine crystals pin the magnetization rotation of spin (in particular, the rotation in the circumferential direction) to increase the anisotropic magnetic field. In addition, the fine crystals (crystalline phases) have a higher density than that of the amorphous phase and therefore generate an internal stress (compressive stress) in the contraction direction due to the density difference, thus increasing the anisotropic magnetic field.

Next, when heat-treating the amorphous wire comprising a Co-based alloy that contains Cu, Cu serves as product nuclei to promote the appearance of fine crystals. This lowers at least the crystallization start temperature of the amorphous wire. As a result, in the magneto-sensitive wire of the present invention, the appearance of fine crystals and the increase of the anisotropic magnetic field occur from a low-temperature region.

Thus, according to the production method of the present invention, a magneto-sensitive wire having an increased anisotropic magnetic field can be stably obtained without performing strict temperature management. Moreover, as a result of promoting the precipitation of fine crystals, both the maintenance of soft magnetic properties and the increase of the anisotropic magnetic field can be achieved at a higher level than the conventional techniques.

In the magneto-sensitive wire thus obtained, it is considered that Cu is contained in at least a part of the crystal grains dispersed in the amorphous phase (crystal grains formed with the product nuclei of Cu). Note, however, that the existence form of Cu (such as a compound or a solid solution) in the crystal grains, the composition of Cu, etc. are not limited.

<<Element/Sensor>>

The present invention can also be perceived as an element or a sensor in which the above-described magneto-sensitive wire is used. For example, the present invention may be perceived as a magneto-impedance element (MI element) that includes the magneto-sensitive wire and a detection coil wound around the magneto-sensitive wire, a magneto-impedance sensor (MI sensor) that includes the MI element, or other similar devices.

<<Others>>

(1) The "crystal grains" as referred to in the present specification are usually very fine and have a size within a range in which the crystal grains can be observed at least with a transmission electron microscope (TEM). The grain diameter (maximum length observed with a TEM image) is, for example, 1 to 150 nm in an embodiment, 5 to 70 nm in another embodiment, or 10 to 50 nm in a further embodiment.

It suffices that the "amorphous (phase)" as referred to in the present specification is at least in an amorphous state to such an extent that the crystals cannot be observed with TEM.

The "crystallization start temperature" and "crystallization end temperature" as referred to in the present specification are determined, respectively, as a first (heat generation) peak temperature (Tx1: primary crystallization temperature) and a subsequent next (heat generation) peak temperature (Tx2: secondary crystallization temperature) that appear when an amorphous wire is measured by differential scanning calorimetry (DSC). The crystallization start temperature is usually a temperature at which the crystal grains begin to appear (precipitate) from the amorphous phase. The crystallization end temperature is usually a temperature at which the entire amorphous phase crystallizes and the appearance of the crystal grains stops.

(2) Unless otherwise stated, a numerical range "x to y" as referred to in the present specification includes the lower limit x and the upper limit y. Any numerical value included in various numerical values or numerical ranges described in the present specification may be selected or extracted as a new lower or upper limit, and any numerical range such as "a to b" can thereby be newly provided using such a new lower or upper limit.

EMBODIMENTS FOR CARRYING OUT THE INVENTION

Figure 1:
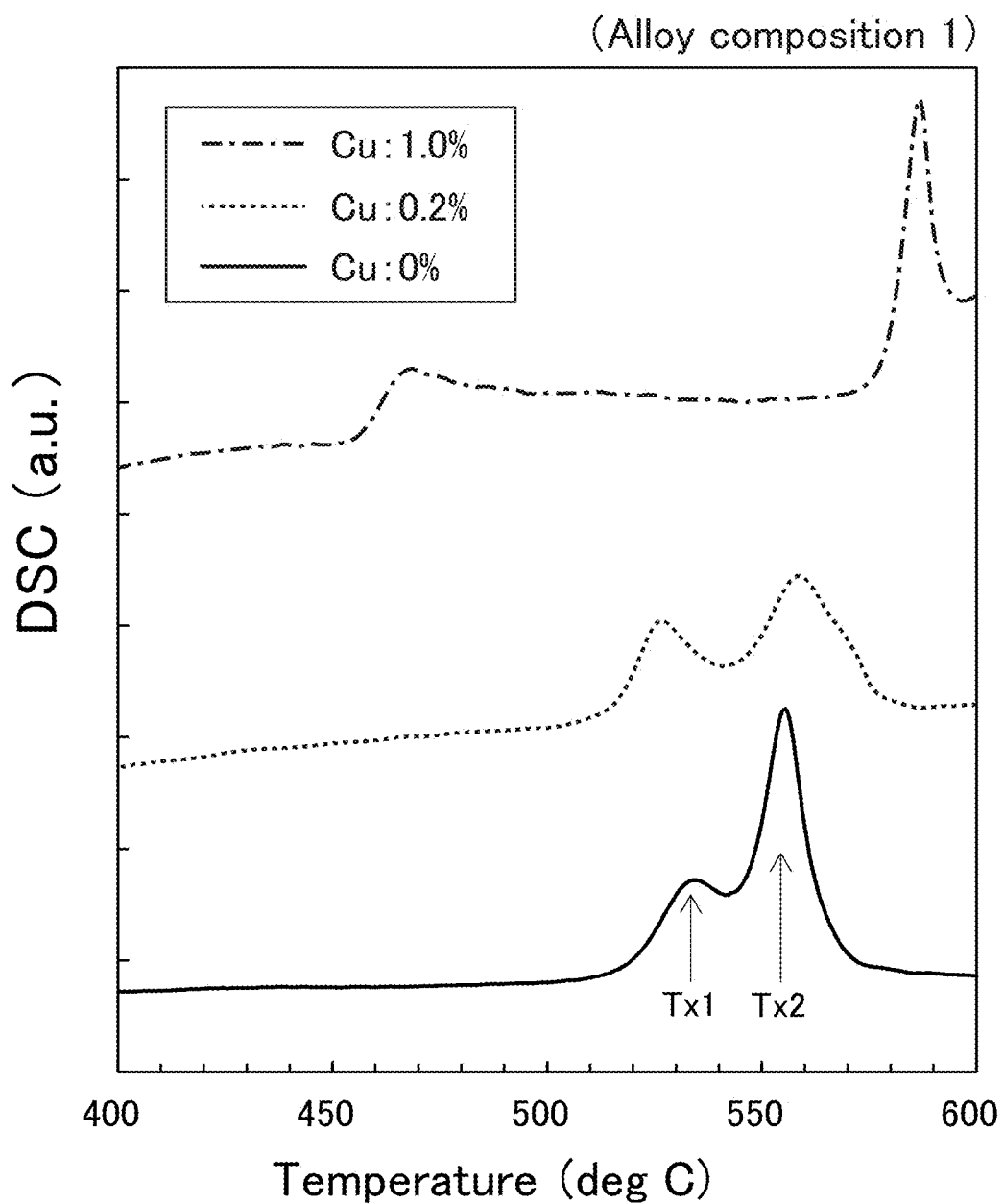
FIG. 1 is a graph illustrating measurement results of DSC according to a first example.

One or more features freely selected from the present specification can be added to the above-described features of the present invention. The content described in the present specification corresponds not only to the magneto-sensitive wire of the present invention but also to a method of producing the same and relevant techniques, as appropriate. Methodological features can even be features regarding a product.

<<Co-Based Alloy>>

(1) The Co-based alloy is composed of Co and plural types of alloy elements in order to constitute an amorphous soft magnetic alloy. First, Co, which is the main component (the balance), is contained, for example, in an amount of more than 50 at % in an embodiment, 60 at % or more in another embodiment, 65 at % or more in still another embodiment, or 70 at % or more in a further embodiment with respect to the Co-based alloy as a whole. Suffice it to say that Co may be contained in an amount of 85 at % or less in an embodiment, 80 at % or less in another embodiment, or 75 at % or less in a further embodiment with respect to the Co-based alloy as a whole.

Unless otherwise stated, the alloy composition as referred to in the present specification is represented by an atomic ratio (stoichiometric ratio). Representation of the alloy composition includes a ratio to the Co-based alloy as a whole (100 at %) and a ratio to the total amount of the group of magnetic elements (Co+Fe+Ni) as a whole (100 at %). Unless otherwise stated, the ratio to the Co-based alloy as a whole (100 at %) is referred to. Note that Fe or Ni is not necessarily an essential element of the Co-based alloy. Accordingly, when the ratio to the total amount of the group of magnetic elements is referred to, the Co-based alloy may contain Co and Fe, may contain Co and Ni, may contain Co, Fe, and Ni, or may contain only Co.

(2) The Co-based alloy may contain Fe so that the magneto-sensitive wire (amorphous wire) has zero magnetostriction (e.g., the absolute value of magnetostriction is less than $10^{-6}$) or its vicinity. Fe is contained, for example, in an amount of 2.5 to 12 at % in an embodiment or 3 to 10 at % in another embodiment with respect to the total amount of the group of magnetic elements as a whole. For example, Fe is contained in an amount of 2 to 10 at % in an embodiment or 2.5 to 8 at % in another embodiment with respect to the Co-based alloy as a whole.

The Co-based alloy may contain Ni in order to be an amorphous soft magnetic alloy. Ni is contained, for example, in an amount of 1 to 3 at % in an embodiment or 1.5 to 2.5 at % in another embodiment with respect to the total amount of the group of magnetic elements as a whole. For example, Ni is contained in an amount of 0.5 to 2.5 at % in an embodiment or 1 to 2 at % in another embodiment with respect to the Co-based alloy as a whole.

The total amount of the group of magnetic elements consisting of Co, Fe, and Ni is, for example, an amount of 65 to 90 at % in an embodiment or 70 to 85 at % in another embodiment with respect to the Co-based alloy as a whole.

(3) The Co-based alloy may contain Si and/or B. Si and/or B are contained, for example, in an amount of 20 to 35 at % in an embodiment or 24 to 33 at % in another embodiment as the total (Si+B) with respect to the total amount of the group of magnetic elements as a whole. For example, Si and/or B are contained in an amount of 15 to 27 at % in an embodiment or 18 to 25 at % in another embodiment as the total with respect to the Co-based alloy as a whole. When only one of Si and B is used, it is contained, for example, in an amount of 10 to 20 at % in an embodiment or 12 to 18 at % in another embodiment with respect to the total amount of the group of magnetic elements as a whole. For example, one of Si and B is contained in an amount of 7 to 17 at % in an embodiment or 9 to 15 at % in another embodiment with respect to the Co-based alloy as a whole. Si and B contribute to the formation of an amorphous Co-based alloy and the appearance of crystal grains. Note, however, that if they are excessive, the anisotropic magnetic field tends to change suddenly with respect to the treatment temperature.

(4) The Co-based alloy may further contain Mo, Cr, Nb, Zr, etc. These elements can also contribute to the formation of an amorphous Co-based alloy. These elements are contained, for example, in an amount of 0.5 to 4 at % in an embodiment or 1 to 3 at % in another embodiment as the total with respect to the Co-based alloy as a whole. When only Mo is used, it may be contained, for example, in an amount of 0.5 to 2.5 at % in an embodiment or 1 to 2 at % in another embodiment with respect to the Co-based alloy as a whole.

(5) As previously described, Cu promotes lowering the temperature (crystallization start temperature) at which the crystal grains appear from the amorphous phase and widening the temperature range (crystallization start temperature to crystallization end temperature). If the amount of Cu is unduly small, such effects will be poor, while if the amount of Cu is unduly large, the coercive force will increase. Cu is preferably contained, for example, in an amount of 0.05 to 0.80 at % in an embodiment, 0.10 to 0.60 at % in another embodiment, or 0.15 to 0.40 at % in a further embodiment with respect to the Co-based alloy as a whole.

<<Composite Structure>>

When a wire (amorphous wire) composed of an amorphous phase as a whole is subjected to heat treatment (such as tension annealing), a magneto-sensitive wire having a composite structure in which crystal grains are dispersed in the amorphous phase is obtained. The crystal grains are fine and are observed by TEM as previously described. The arithmetic average value (average diameter) of the particle diameters (maximum lengths) of crystal grains observed in the field of view is, for example, 1 to 150 nm in an embodiment, 5 to 70 nm in another embodiment, or 10 to 50 nm in a further embodiment. The coarsening of crystal grains causes an increase in the coercive force (increase in the hysteresis) and the like.

The particle number density of crystal grains in the composite structure is, for example, 5.5 to 10 ($\times 10^{-6}$/nm$^3$) in an embodiment or 6 to 9 ($\times 10^{-6}$/nm$^3$) in another embodiment. If the particle number density is unduly low, a sufficient anisotropic magnetic field cannot be obtained. An unduly high particle number density causes a decrease in the sensitivity of the magnetic sensor and an increase in the hysteresis. The particle number density is also obtained by image-processing the observed image using analysis software attached to the TEM.

<<Production Method>>

(1) Amorphous Wire

The amorphous wire can be produced through various methods. Examples of typical methods of producing amorphous wires include the modified Tailor method (references: WO93/5904, or Japanese Translation of PCT International Application, No. 8-503891, etc.) and the in-rotating-liquid spinning method (references: JP57-79052A, etc.). The amorphous wire is drawn to a desired wire diameter as appropriate before the heat treatment step.

(2) Heat Treatment Step

The magneto-sensitive wire having a composite structure is obtained, for example, by heat-treating an amorphous wire. The temperature for the heat treatment (specific temperature: T) may be adjusted between the crystallization start temperature (Tx1) and the crystallization end temperature (Tx2) (Tx1≤T<Tx2) in accordance with the desired anisotropic magnetic field. If the specific temperature is unduly low, the anisotropic magnetic field cannot be increased, while if the specific temperature is unduly high, the coercive force will increase rapidly.

The specific temperature may also be, for example, equal to or higher than a first temperature (T1) at which the magneto-sensitive wire having an anisotropic magnetic field (Hk) of 10 Oe is obtained (Tx1≤T1≤T). Additionally or alternatively, the specific temperature may be equal to or lower than a second temperature (T2) at which the magneto-sensitive wire having an anisotropic magnetic field of 40 Oe or 20 Oe is obtained (T≤T2<Tx2). When the amorphous wire is heated in a furnace, the specific temperature (T) is the atmosphere temperature in the furnace.

Depending on the component composition and wire diameter of the amorphous wire and other factors, the treatment time is, for example, 0.5 to 15 seconds in an embodiment or 1 to 10 seconds in another embodiment. An unduly short time may cause insufficient appearance of the crystal grains, while an unduly long time may cause the crystal grains to readily grow to become coarse. The heat treatment may be performed in an air atmosphere or otherwise in an inert gas atmosphere or a vacuum atmosphere.

The heat treatment step may be an annealing step performed without applying tensile stress (external stress) to the amorphous wire or may also be a tension annealing step performed while applying tensile stress to the amorphous wire. When the tension annealing (TA) is performed, in addition to the internal stress due to the composite structure, the internal stress due to the external stress is additively or synergistically introduced into the magneto-sensitive wire. The amorphous wire may be not only elastically deformed but also plastically deformed due to the tensile stress, provided that the amorphous wire does not break.

<<Magneto-Sensitive Wire>>

The cross section of the magneto-sensitive wire is usually circular. The wire diameter is, for example, 1 to 150 μm in an embodiment, 3 to 80 μm in another embodiment, or 5 to 30 μm in a further embodiment. If the wire diameter is unduly small, the sensitivity of the magnetic sensor will be lowered. If the wire diameter is unduly large, strict management of the cooling rate for forming an amorphous magneto-sensitive wire will be required.

<<Application>>

The magneto-sensitive wire of the present invention can be used for various magnetic sensors. The magneto-sensitive wire of the present invention is suitable for the magneto-sensitive body of an MI sensor that is excellent in the responsivity, sensitivity, power consumption, and other properties.

EXAMPLES

A number of amorphous wires having different alloy compositions were produced, which were used to reveal the relationship between the treatment temperature and the magnetic characteristics. In addition, the metallographic structures of the amorphous wires after the tension annealing were observed. The present invention will be described in more detail below with reference to such specific examples.

First Example

<<Making of Samples>>

(1) Amorphous Wires

The raw materials compounded in the alloy composition 1 (unit: at %) listed below were arc-melted to obtain Co-based alloys with different Cu content ratios (x: 0≤x≤1). Using each Co-based alloy, a glass-coated wire was produced by the modified Tailor method. When confirmed with a scanning electron microscope (SEM), the diameter of the core portion (metal portion other than the glass) of each wire was about 11 μm. In addition, when confirmed with an X-ray diffraction method, the entire structure of the core portion was amorphous (phase).

<Alloy Composition 1>

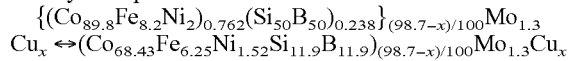

(2) Heat Treatment Step

Each wire was subjected to continuous heat treatment (tension annealing) by winding the wire and passing it through a heating furnace provided in mid-course while applying tension to the wire. The treatment conditions at that time were as follows.

The treatment conditions were set to include the applied tensile stress σ=200 MPa, the passing time in the heating furnace (time in the furnace): 6.7 seconds, the length of the heating furnace to pass through: 0.52 m, and the treatment atmosphere: in the air. The atmosphere temperature (referred to as a "treatment temperature"/specific temperature) in the heating furnace to pass through was variously changed in a range of 500° C. to 600° C.

<<Measurement>>

(1) Magnetic Characteristics

For each wire heat-treated at various treatment temperatures, the magnetic characteristics (anisotropic magnetic field: Hk, coercive force: iHc) were measured using a vibrating sample magnetometer (available from Toei Scientific Industrial Co., Ltd., PV-M10-5). Relationships between the amount of Cu (x), the treatment temperature, and the magnetic characteristics are collectively listed in Table 1.

(2) Differential Scanning Calorimetry (DSC)

Differential scanning calorimetry (DSC) was performed on each wire (amorphous wire) before the heat treatment. Some of the measurement results (Cu: 0 at %, 0.20 at %, 1.00 at %) are collectively illustrated in FIG. 1.

<<Observation>>

Figure 2:
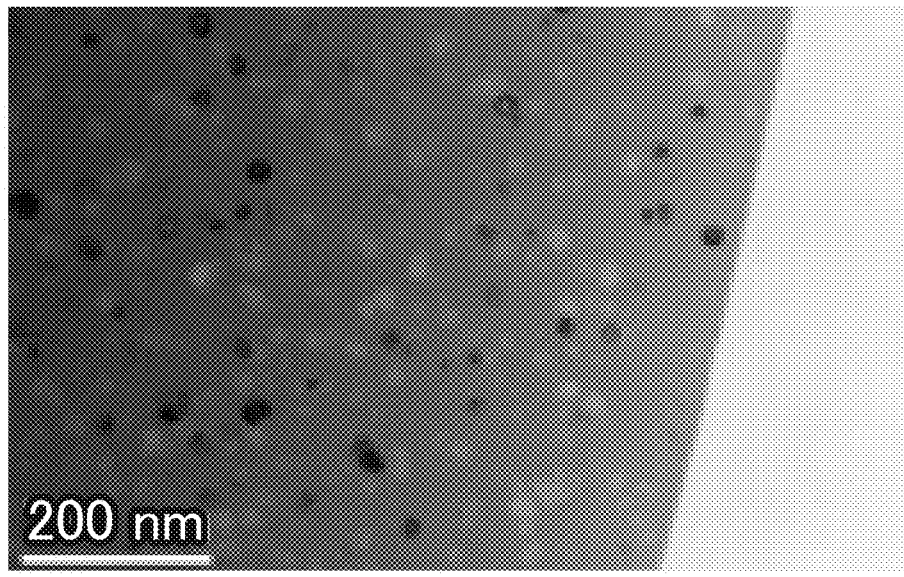
FIG. 2 is a set of HR-TEM images when observing cross sections of wires (Cu: 0% and Cu: 0.20%) according to the first example.
Figure 2:
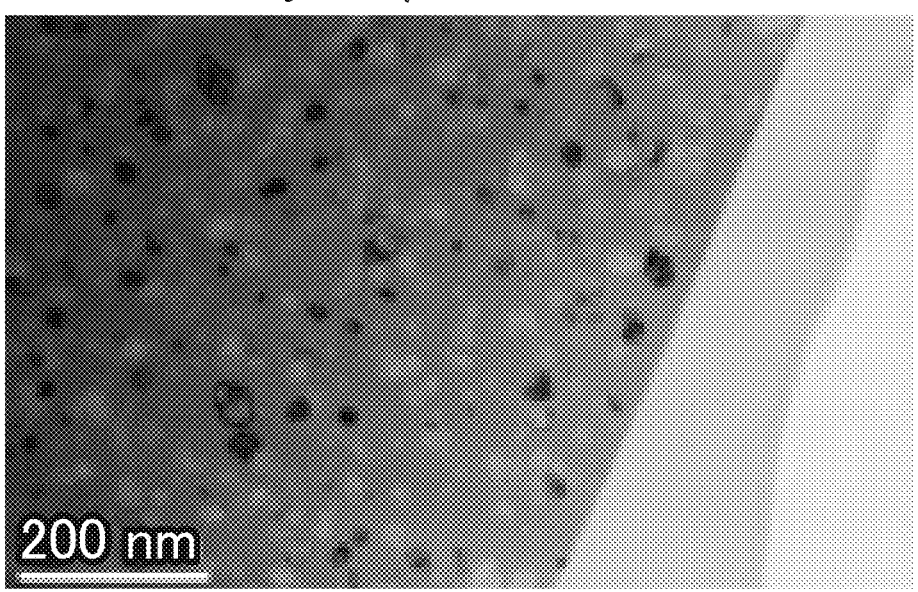

The cross section of each wire after the heat treatment was observed with a high resolution transmission electron microscope (HR-TEM: available from JEOL Ltd., JEM-2100F). Some of the obtained TEM images (BF) (Cu: 0 at %, 0.20 at %/treatment temperature: 580° C.) are shown in FIG. 2.

On the basis of the obtained TEM images, the average diameter (arithmetic average of the maximum lengths in a plan view) and particle number density of the crystal grains confirmed in the field of view (about 3 μm×2 μm/sample thickness: 0.1 μm) were calculated using the image processing software attached to the HR-TEM.

<<Evaluation>>

(1) Temperature Range of Crystallization

As apparent from FIG. 1, all the DSC curves exhibited double peaks. As the Cu content ratio increased, the prior peak (left side in the figure) indicating the crystallization start temperature (T1x) shifted to the lower temperature side. In addition, the interval between the prior peak and the posterior peak (right side in the figure) indicating the crystallization end temperature (Tx2) was expanded. It has therefore been found that when the Co-based alloy contains Cu, the crystallization start temperature (temperature at which crystal grains start to appear from the amorphous phase of the wire) is lowered, and the temperature range (from the crystallization start temperature to the crystallization end temperature) in which the crystal grains can appear is expanded.

(2) Composite Structure

As apparent from FIG. 2, when the Co-based alloy contained Cu, a composite structure in which a large number of crystal grains appeared was obtained even at the same treatment temperature. When Cu was 0%, the average diameter of the crystal grains was 18 nm and the particle number density was $5.2 \times 10^{-6}/nm^3$. When Cu was 0.20%, the average diameter of the crystal grains was 20 nm and the particle number density was $8.7 \times 10^{-6}/nm^3$. Also from these, it has been revealed that Cu is involved in the appearance of crystal grains.

It can also be found from FIG. 2 that the crystal grains are very fine with a grain diameter of about 50 nm at the maximum. It has been confirmed by the selected area diffraction that the small dots appearing black or white in FIG. 2 are fine crystal grains. It has also been confirmed that Cu is contained in the crystal grains, by a three-dimensional atom probe (available from AMTEK, LEAP4000XSi).

(3) Anisotropic Magnetic Field

As apparent from Table 1, it can be found that when the Co-based alloy contains Cu, the same anisotropic magnetic field (Hk) occurs in a lower temperature region than when the Co-based alloy does not contain Cu (Cu: 0 at %).

It can also be found from Table 1 that when the Co-based alloy contains Cu, the treatment temperature range (temperature difference) corresponding to a predetermined range of the anisotropic magnetic field (e.g., Hk=10 to 40 Oe) is expanded. That is, it can be said that when the Co-based alloy contains Cu, the temperature dependence of the anisotropic magnetic field is moderate.

Such a tendency occurs regardless of the amount of Cu at least in a range of Cu≤1.00 at % and is consistent with the previously described DSC measurement results. Note, however, that when the amount of Cu is close to 1.00 at % as the content ratio, the treatment temperature range is expanded, but the coercive force is also increased. Therefore the amount of Cu in the Co-based alloy is preferably 0.05 to 0.80 at % and particularly preferably 0.10 to 0.60 at %.

Second Example

<<Making of Samples/Measurement>>

The raw materials compounded in the alloy compositions 2 to 4 (unit: at %) listed below were arc-melted to obtain plural types of Co-based alloys with different Cu content ratios (x: 0≤x≤1). As in the case of the first example, each amorphous wire made by the improved Tailor method was subjected to heat treatment (tension annealing) in which the treatment temperature was variously changed. The treatment temperature range was set to 500° C. to 600° C. for the alloy composition 2 and 540° C. to 640° C. for the alloy compositions 3 and 4. The reason why the treatment temperature range was changed in accordance with the alloy composition is that the temperature range in which fine crystals are precipitated differs depending on the content ratios of Si and B in the Co-based alloy.

As in the first example, the magnetic characteristics of each wire after the heat treatment were measured. Relationships between the Cu content ratio (x), the treatment temperature, and the magnetic characteristics are collectively listed in Table 2 (alloy composition 2), Table 3 (alloy composition 3), and Table 4 (alloy composition 4).

<Alloy Composition 2>

$\{(Co_{92.7}Fe_{5.3}Ni_2)_{0.8}(Si_{50}B_{50})_{0.2}\}_{(98.5-x)/100}Mo_{1.5}Cu_x \leftrightarrow (Co_{74.16}Fe_{4.24}Ni_{1.6}Si_{10}B_{10})_{(98.5-x)/100}Mo_{1.5}Cu_x$ <Alloy Composition 3>

$\{(Co_{94.6}Fe_{3.4}Ni_2)_{0.765}(Si_{50}B_{50})_{0.235}\}_{(98.5-x)/100}Mo_{1.5}Cu_x \leftrightarrow (Co_{72.37}Fe_{2.6}Ni_{1.53}Si_{11.75}B_{11.75})_{(98.5-x)/100}Mo_{1.5}Cu_x$ <Alloy Composition 4>

$\{(Co_{88.2}Fe_{9.8}Ni_2)_{0.765}(Si_{50}B_{50})_{0.235}\}_{(98.5-x)/100}Mo_{1.5}Cu_x \leftrightarrow (Co_{67.47}Fe_{7.5}Ni_{1.53}Si_{11.75}B_{11.75})_{(98.5-x)/100}Mo_{1.5}Cu_x$ <<Evaluation>>

As apparent from comparison between Tables 2 to 4 and Table 1, it has been found that the same tendency as in the first example is exhibited even when the alloy composition is changed. That is, it has been found that even when the Co-based alloys have different alloy compositions, Cu is contained thereby to be able to lower the treatment temperature at which a desired anisotropic magnetic field (Hk) is obtained and expand the treatment temperature range in which the anisotropic magnetic field can be adjusted.

Moreover, the same tendency has been found that even when the alloy composition changes, at a Cu content ratio of 1.00 at %, the treatment temperature range expands while the coercive force also increases rapidly.

From the above, it has been revealed that according to the magneto-sensitive wire of the present invention, the treatment temperature at which a desired anisotropic magnetic field can be obtained is lowered and its range is widened; therefore, a magneto-sensitive wire having an anisotropic magnetic field corresponding to the measurement range can be stably obtained.

TABLE 1

Alloy composition 1:
$\{(Co_{89.8}Fe_{8.2}Ni_{2.0})_{0.762}(Si_{50}B_{50})_{0.238}\}_{(98.7-x)/100}Mo_{1.3}Cu_x$

| Treatment temperature | | Cu (at %) | | | | | |
|---|---|---|---|---|---|---|---|
| (° C.) | | 0 | 0.10 | 0.20 | 0.30 | 0.50 | 1.00 |
| Hk | 10 | 569 | 560 | 552 | 557 | 547 | 540 |
| (Oe) | 20 | 572 | 566 | 562 | 563 | 555 | 555 |
|  | 40 | 577 | 571 | 572 | 573 | 562 | 572 |
| Treatment temperature difference (° C.) when Hk: 10 to 40 (Oe) | | 8 | 11 | 20 | 16 | 15 | 32 |
| Coercive force (Oe) when Hk: 40 (Oe) | | 0.7 | 1.0 | 0.8 | 1.1 | 1.2 | 6.2 |

TABLE 2

Alloy composition 2:
$\{(Co_{92.7}Fe_{5.3}Ni_{2.0})_{0.8}(Si_{50}B_{50})_{0.2}\}_{(98.5-x)/100}Mo_{1.5}Cu_x$

| Treatment temperature | | Cu (at %) | | | | | |
|---|---|---|---|---|---|---|---|
| (° C.) | | 0 | 0.10 | 0.20 | 0.30 | 0.50 | 1.00 |
| Hk | 10 | 475 | 465 | 458 | 464 | 455 | 446 |
| (Oe) | 20 | 481 | 474 | 473 | 474 | 466 | 463 |
|  | 40 | 494 | 487 | 489 | 488 | 481 | 488 |
| Treatment temperature difference (° C.) when Hk: 10 to 40 (Oe) | | 19 | 22 | 31 | 24 | 26 | 42 |
| Coercive force (Oe) when Hk: 40 (Oe) | | 0.7 | 1.0 | 0.8 | 1.2 | 1.4 | 5.9 |

TABLE 3

Alloy composition 3:
$\{(Co_{94.6}Fe_{3.4}Ni_{2.0})_{0.765}(Si_{50}B_{50})_{0.235}\}_{(98.5-x)/100}Mo_{1.5}Cu_x$

| Treatment temperature | | Cu (at %) | | | | | |
|---|---|---|---|---|---|---|---|
| (° C.) | | 0 | 0.10 | 0.20 | 0.30 | 0.50 | 1.00 |
| Hk | 10 | 593 | 584 | 576 | 578 | 568 | 563 |
| (Oe) | 20 | 610 | 604 | 603 | 600 | 592 | 592 |
|  | 40 | — | — | — | — | — | — |
| Treatment temperature difference (° C.) when Hk: 10 to 20 (Oe) | | 17 | 20 | 27 | 22 | 24 | 29 |
| Coercive force (Oe) when Hk: 40 (Oe) | | 1.2 | 1.5 | 1.2 | 1.6 | 1.9 | 6.2 |

TABLE 4

Alloy composition 4:
$\{(Co_{88.2}Fe_{9.8}Ni_{2.0})_{0.765}(Si_{50}B_{50})_{0.235}\}_{(98.5-x)/100}Mo_{1.5}Cu_x$

| Treatment temperature | | Cu (at %) | | | | | |
|---|---|---|---|---|---|---|---|
| (° C.) | | 0 | 0.10 | 0.20 | 0.30 | 0.50 | 1.00 |
| Hk | 10 | 590 | 580 | 572 | 579 | 569 | 559 |
| (Oe) | 20 | 595 | 588 | 585 | 587 | 577 | 577 |
| | 40 | 600 | 593 | 594 | 594 | 587 | 597 |
| Treatment temperature difference (° C.) when Hk: 10 to 40 (Oe) | | 10 | 13 | 22 | 15 | 18 | 38 |
| Coercive force (Oe) when Hk: 40 (Oe) | | 1.0 | 1.4 | 1.1 | 1.6 | 1.8 | 6.3 |

The invention claimed is:

1. A magneto-sensitive wire for magnetic sensors, comprising a Co-based alloy having an amorphous phase,
the Co-based alloy containing, with respect to 100 at % of the Co-based alloy as a whole,
more than 50 at % of Co,
2 to 10 at % of Fe,
0.5 to 2.5 at % of Ni,
15 to 27 at % of Si and B as a total,
0.5 to 2.5 at % of Mo, and
0.05 to 0.80 at % of Cu,
the Co-based alloy having a composite structure in which crystal grains are dispersed in the amorphous phase.

2. The magneto-sensitive wire for magnetic sensors according to claim 1, wherein at least a part of the crystal grains contains Cu.

3. The magneto-sensitive wire for magnetic sensors according to claim 1, wherein the Co-based alloy contains 60 at % or more of Co with respect to the Co-based alloy as a whole.

4. The magneto-sensitive wire for magnetic sensors according to claim 3, wherein the Co-based alloy contains 65 to 90 at % of Co, Fe, and Ni as a total with respect to the Co-based alloy as a whole.

5. The magneto-sensitive wire for magnetic sensors according to claim 4, wherein the Fe is contained in an amount of 2.5 to 12 at % with respect to the total amount of Co, Fe, and Ni.

6. The magneto-sensitive wire for magnetic sensors according to claim 4, wherein the Ni is contained in an amount of 1 to 3 at % with respect to the total amount of Co, Fe, and Ni.

7. The magneto-sensitive wire for magnetic sensors according to claim 4, wherein the Co-based alloy contains 20 to 35 at % of Si and B as a total with respect to the total amount of Co, Fe, and Ni.

8. A method of producing a magneto-sensitive wire for magnetic sensors, comprising
a heat treatment step of heating an amorphous wire comprising a Co-based alloy at a specific temperature equal to or higher than a crystallization start temperature and lower than a crystallization end of the Co-based alloy the Co-based alloy containing with respect to 100 at % of the Co-based alloy as a whole, more than 50 at % of Co, 2 to 10 at % of Fe, 0.5 to 2.5 at % of Ni, 15 to 27 at % of Si and B as a total, 0.5 to 2.5 at % of Mo, and 0.05 to 0.80 at % of Cu,
wherein a magneto-sensitive wire for magnetic sensors that comprises a composite structure in which crystal grains are dispersed in an amorphous phase is obtained.

9. The method of producing a magneto-sensitive wire for magnetic sensors according to claim 8, wherein the heat treatment step is a tension annealing step performed while applying tensile stress to the amorphous wire.

10. The method of producing a magneto-sensitive wire for magnetic sensors according to claim 8, wherein the specific temperature is equal to or higher than a first temperature at which the magneto-sensitive wire for magnetic sensors that has an anisotropic magnetic field (Hk) of 10 Oe is obtained.

* * * * *